United States Patent [19]
Arakawa

[11] Patent Number: 6,031,571
[45] Date of Patent: Feb. 29, 2000

[54] SOLID-STATE IMAGING DEVICE

[75] Inventor: Kenichi Arakawa, Fujisawa, Japan

[73] Assignee: Kabushiki Kaisha Toshiba, Kawasaki, Japan

[21] Appl. No.: 08/863,019

[22] Filed: May 23, 1997

[30] Foreign Application Priority Data

May 30, 1996 [JP] Japan ..................................... 8-136750

[51] Int. Cl.$^7$ .............................. H04N 3/14; H04N 5/335
[52] U.S. Cl. ........................... 348/316; 348/321; 348/323
[58] Field of Search ..................................... 348/314, 321, 348/323; 257/288, 379, 536; 377/60; 327/142, 143

[56] References Cited

U.S. PATENT DOCUMENTS

| | | | |
|---|---|---|---|
| 3,953,255 | 4/1976 | Combs, Jr. ............................... | 148/187 |
| 4,288,800 | 9/1981 | Yohida et al. ............................. | 357/22 |
| 4,335,406 | 6/1982 | Ohba et al. .............................. | 358/213 |
| 4,716,323 | 12/1987 | Wada et al. .............................. | 307/594 |
| 4,984,256 | 1/1991 | Imai ......................................... | 377/60 |
| 4,996,686 | 2/1991 | Imai et al. ................................ | 377/60 |
| 5,033,068 | 7/1991 | Imai ......................................... | 377/60 |
| 5,065,056 | 11/1991 | Imai et al. ................................ | 307/540 |
| 5,471,515 | 11/1995 | Fossum et al. ........................... | 377/60 |

OTHER PUBLICATIONS

Toshiba Technical Report No. 95–0186, vol. 13–17. pp.141–142 Obata: Mar. 20, 1995.

*Primary Examiner*—Tuan Ho
*Assistant Examiner*—Eric Ferguson
*Attorney, Agent, or Firm*—Finnegan, Henderson, Farabow, Garrett & Dunner, L.L.P.

[57] ABSTRACT

A solid-state imaging device has a storage section formed on a surface portion of a semiconductor substrate to receive and store signal charges, a discharge section formed on the surface portion of the substrate at a predetermined distance from the storage section, a reset section constituted by a depletion-type MOS transistor formed between the storage section and the discharge section, and reset voltage setting means for setting a voltage of a reset pulse to be applied to the reset section. The reset voltage setting section has first and second resistive elements series-connected between one end to which a predetermined voltage is applied and the other end which is grounded. A node which connects the first resistive element to the second resistive element is connected to a reset voltage application electrode. The second resistive element consists of a depletion-type MOS transistor, and the depletion-type MOS transistor has a depletion-type impurity layer formed by the same process as that of a depletion-type impurity layer of the reset section.

20 Claims, 4 Drawing Sheets

SOLID-STATE IMAGING DEVICE

BACKGROUND OF THE INVENTION

The present invention relates to a solid-state imaging device and, more particularly, to a reset voltage setting circuit for setting the reset voltage to be applied to a signal charge detecting section for detecting signal charges when the section is reset.

FIG. 1 schematically shows the overall arrangement of a solid-state imaging device 100 to which the present invention can be applied. The solid-state imaging device 100 comprises a photosensitive area 105, a horizontal transfer CCD (Charge-Coupled Device) 103, and an output area 104. The photosensitive area 105 has photosensitive pixels 101 two-dimensionally arranged in the vertical direction in FIG. 1, and vertical transfer CCDs 102 adjacent to the photosensitive pixels 101. The photosensitive pixels 101 generate signal charges upon irradiation of light. The photosensitive pixels 101 store the signal charges and output them to the vertical transfer CCDs 102. The vertical transfer CCDs 102 transfer the supplied signal charges in the vertical direction in accordance with the timing of a transfer pulse.

The signal charges transferred by the vertical transfer CCDs 102 are transferred by the horizontal transfer CCD 103 in the horizontal direction. The signal charges transferred by the horizontal transfer CCD 103 are supplied to the output area 104. The output area 104 includes a floating diffusion layer, a source follower circuit, a reset gate, and a reset drain. The floating diffusion layer stores the signal charges transferred from the horizontal transfer CCD 103. The source follower circuit converts the stored signal charges into a voltage signal. Upon reception of a reset pulse, the reset gate transfers the signal charges stored in the floating diffusion layer to the reset drain.

FIG. 2 shows the arrangement of the reset voltage setting circuit of a conventional charge detecting section. Signal charges are generated by pixels and sequentially transferred by a CCD register. The signal charges are then transferred to a floating diffusion layer 1 through an output gate OG set at a predetermined voltage and temporarily stored. The floating diffusion layer 1 consists of a diffusion layer having a conductivity type opposite to that of a semiconductor substrate, and is formed at a predetermined distance from a reset drain diffusion layer 2 having the same conductivity type as that of the floating diffusion layer 1 through a channel region doped with a predetermined concentration of an impurity having the same conductivity type as that of the floating diffusion layer 1. A reset gate electrode is formed on the channel region through an insulating film (not shown). The floating diffusion layer 1, the channel region, the reset drain diffusion layer 2, and the reset gate electrode constitute a depletion-type (to be referred to as a D-type hereinafter) MOS transistor, which operates as a reset transistor 3.

A source follower circuit 9 is connected to the floating diffusion layer 1. In the source follower circuit 9, an N-channel transistor 10 and a D-type transistor 11 serving as a resistive element are series-connected between a power supply voltage terminal Vcc and the ground terminal, and the gate of the transistor 10 is connected to the floating diffusion layer 1. The node between one end of the transistor 10 and one end of the transistor 11 is connected to an output terminal 12.

The signal charges stored in the floating diffusion layer 1 are converted into a voltage signal by the source follower circuit 9. The voltage signal is then output from the output terminal 12.

An external capacitor 4 is connected to the reset gate electrode. A reset pulse is applied from a reset terminal 5 to the reset gate electrode through the external capacitor 4. A power supply 8 is connected to the reset drain 2, to which a reset drain voltage VRD is applied. A voltage dividing circuit 7 is connected between the reset drain 2 and the reset gate electrode to perform a normal reset operation by canceling out setting variations of the reset drain voltage VRD. In the voltage dividing circuit 7, resistors R1 and R2 are series-connected between the reset drain 2 and the ground terminal, and the node between the resistors R1 and R2 is connected to the reset gate electrode of said reset section. In this case, the resistors R1 and R2 consist of diffused resistors. With this voltage dividing circuit 7, a voltage VRS obtained by resistively dividing the voltage VRD of the power supply 8 is applied to the reset gate electrode.

The level of a reset pulse for a normal reset operation will be described next. The potential at the region under the gate electrode of the reset transistor 3 upon application of a high-level reset pulse must be higher than the voltage VRD of the power supply 8.

Assume that the potential at the region beneath the gate electrode upon application of a high-level reset pulse is higher than the voltage VRD by a reset transfer margin $\Phi 2$. In order to allow the source follower circuit 9 to output a detection voltage of about 1.5 V or more, signal charges must be stored in the floating diffusion layer 1 in a predetermined quantity or more. For this purpose, a voltage lower than the voltage VRD by a reset barrier margin $\Phi 1$ must be generated at the region underneath the gate electrode. As described above, the potential at the region under the gate electrode must be higher than the voltage VRD by the reset transfer margin $\Phi 2$ upon application of a high-level reset pulse, and lower than the voltage VRD by the reset barrier margin $\Phi 1$ upon application of a low-level reset pulse.

FIG. 3 shows the relationship between the voltage VRS and the currents flowing in the resistors R1 and R2 in the voltage dividing circuit 7. A curve L11 represents changes in the current flowing in the resistor R1 with changes in the voltage VRS. As the current flowing the resistor R1 decreases, the voltage VRS rises. A curve L12 represents changes in the current flowing in the resistor R2 with changes in the voltage VRS. As the current flowing in the resistor R2 increases, the voltage VRS rises. The intersection point of the curves L11 and L12 corresponds to the value of the voltage VRS in this circuit.

A curve L13 represents the relationship between the voltage VRS and the current flowing in the resistor R1 when the voltage VRD of the power supply 8 increases by $\Delta$VRD. As the voltage VRD rises, the voltage VRS rises if the current flowing in the resistor R1 remains the same. The intersection point of the curves L12 and L13 indicates the value of the voltage VRS when the voltage VRD rises by $\Delta$VRD. The voltage VRS rises by $\Delta$VRS.

The value $\Delta$VRS is smaller than the value $\Delta$VRD, and the value of $\Delta$VRS/$\Delta$VRD is about 0.8. This is because the current flowing in the resistor R2 changes as the voltage VRD varies. The ratio of the variation in the potential at the region beneath the reset gate electrode to the variation $\Delta$VRD is about 0.7.

In addition, the reset transfer margin $\Phi 2$ must be set to a voltage high enough to absorb the variation $\Delta$VRD in the voltage VRD of the power supply 8 and the variation in the potential at the region under the reset gate electrode. For example, the reset transfer margin $\Phi 2$ must be set to 1.5 V.

The potential at the region under the reset gate varies due to variations in impurity concentration. However, this variation is not fed back to the voltage VRS. This is because, even if the impurity concentration of the region under the reset gate varies, the resistances of the resistors R1 and R2 do not vary in the same manner. For this reason, such a variation in the potential at the region underneath the reset gate must be included in the reset transfer margin Φ2.

Similar to the reset transfer margin Φ2, as the reset drain voltage VRD varies, the reset barrier margin Φ1 varies through the voltage dividing circuit 7. Even if, however, the reset gate potential varies, the reset gate voltage VRS does not vary. For this reason, this variation in the reset gate potential must be included in the reset barrier margin Φ1 as well. As a result, the reset barrier margin Φ1 must be set to a high voltage, e.g., 2.5 V, which is obtained when the potential variation at the region under the reset gate is included in the voltage required to detect signal charges.

The potential width in the region under the reset gate must be set to 3.5 V or more, which is the sum of the margins Φ1 and Φ2. That is, a voltage of about 4 V is required in terms of the voltage VRS to be applied to the reset gate.

As described above, in the conventional charge detecting section, when the potential at the region under the reset gate varies owing to variations in impurity concentration under the reset gate in the manufacturing process, no similar variation is fed back to the circuit for generating the voltage to be applied to the reset gate. For this reason, a pulse having a large amplitude must be applied to the reset gate. The power consumption therefore increases, and a low power supply voltage of about 3.3 V used for peripheral circuits cannot be used.

SUMMARY OF THE INVENTION

It is therefore an object of the present invention to provide a solid-state imaging device which can attain reductions in power consumption and power supply voltage by decreasing the width of the pulse input to a reset gate.

According to the present invention, there is provided a solid-state imaging device comprising a storage section which is formed on a surface portion of a semiconductor substrate to receive and store signal charges, a discharge section formed on the surface portion of the semiconductor substrate at a predetermined distance from the storage section, a reset section constituted by a depletion-type MOS transistor formed between the storage section and the discharge section, and a reset voltage setting section for setting a voltage of a reset pulse to be applied to the reset section, wherein the reset voltage setting section has first and second resistive elements series-connected between one end to which a predetermined voltage is applied and the other end which is grounded, and a node for connecting the first resistive element to the second resistive element, the node is connected to said reset gate electrode, the second resistive element comprises a depletion-type MOS transistor, and the depletion-type MOS transistor has a depletion-type impurity layer formed by the same process as that for a depletion-type impurity layer of the reset section.

As described above, according to the solid-state imaging device of the present invention, since the reset voltage setting section for setting the voltage of a reset pulse includes a transistor formed by the same process as that for the depletion-type MOS transistor of the reset section, the ratio between the variation in reset drain voltage and the variation in reset gate voltage can be set nearly unity. In addition, the reset gate voltage can be adjusted to suppress variations in potential at the region under the reset gate electrode due to variations in the impurity concentration of the region, and the amplitude of the pulse to be input to the reset gate electrode can be reduced, thereby attaining reductions in power consumption and power supply voltage.

In this case, the reset voltage setting section preferably sets a voltage of the reset pulse within a saturation region of the depletion-type MOS transistor constituting the second resistive element.

In addition, the first resistive element may comprise a diffused resistor.

According to the present invention, there is provided a solid-state imaging device comprising a floating diffusion layer which is formed on a surface portion of a semiconductor substrate to receive and store signal charges transferred from an adjacent CCD, a reset drain formed on the surface portion of the semiconductor substrate to oppose the floating diffusion layer through a channel region, a reset gate electrode which is formed on the channel region through an insulating film, and electrically connects the floating diffusion layer to the reset drain through the channel region upon application of a reset pulse to transfer the signal charges stored in the floating diffusion layer to the reset drain, and a reset voltage setting circuit for setting a voltage of the reset pulse to be applied to the reset gate electrode, wherein the reset voltage setting circuit has first and second resistive elements series-connected between one end to which a predetermined voltage is applied and the other end which is grounded, and a node for connecting the first resistive element to the second resistive element, the node is connected to the reset gate electrode, the second resistive element comprises a depletion-type MOS transistor, a channel region of said depletion-type MOS transistor being provided by the same process as that for said channel region of a depletion-type reset transistor including the floating diffusion layer, the reset drain, and the reset gate electrode.

In this case, the reset voltage setting section may include the depletion-type MOS transistor manufactured by the same process as that for a depletion-type reset transistor constituted by the floating diffusion layer, the channel region, the reset drain, and the reset gate electrode, so that an amount of change in impurity concentration of the channel region of the reset transistor due to variations in manufacturing process is substantially the same as an amount of change in impurity concentration of the channel region of the depletion-type transistor included in the reset voltage setting circuit, and when the impurity concentration of the channel region of the reset transistor changes owing to variations in manufacturing process, the voltage of the reset pulse set by the reset voltage setting circuit changes to cancel out the change in impurity concentration.

According to the present invention, there is provided a solid-state imaging device comprising a floating diffusion layer which is formed on a surface portion of a semiconductor substrate to receive and store signal charges transferred from an adjacent CCD, a charge detecting section for detecting the signal charges stored in the floating diffusion layer and outputting a detection signal, a reset drain formed on the surface portion of the semiconductor substrate to oppose the floating diffusion layer through a channel region, a reset gate electrode which is formed on the channel region through an insulating film, and electrically connects the floating diffusion layer to the reset drain through the channel region upon application of a reset pulse to transfer the signal charges stored in the floating diffusion layer to the reset drain, voltage applying circuit, having an output terminal connected to the reset drain, for outputting a predetermined voltage and applying the voltage to the reset drain, and a resistance-type voltage dividing unit having one end connected to the output terminal of the voltage applying circuit, the other end which is grounded, resistive elements including at least first and second resistive elements series-connected between the one end and the other end, and a node for connecting the first resistive element to the second resistive element, the node being connected to the reset gate electrode, wherein the second resistive element comprises a depletion-type MOS transistor, the depletion-type MOS transistor, a channel region of said depletion-type MOS transistor being provided by the same process as that for said channel region of a depletion-type reset transistor including the floating diffusion layer, the reset drain, and the reset gate electrode.

DESCRIPTION OF THE PREFERRED EMBODIMENTS

An embodiment of the present invention will be described below with reference to the accompanying drawings.

Figure 1:
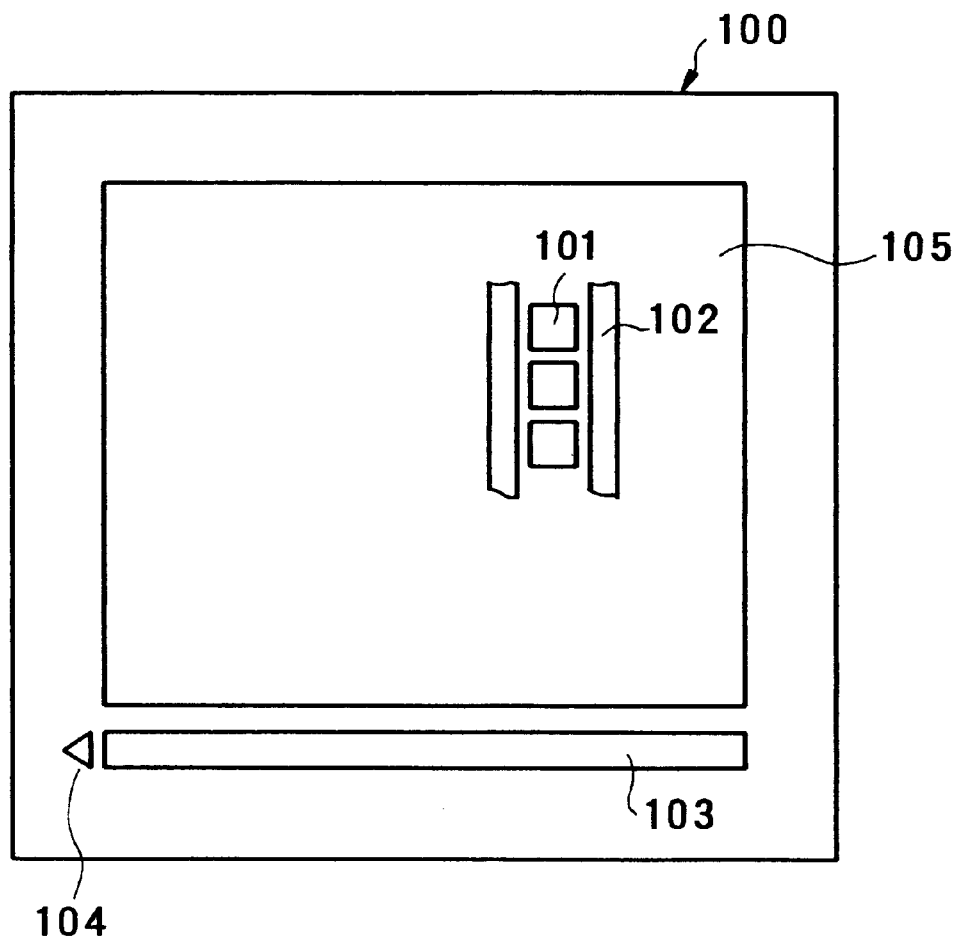
FIG. 1 is a block diagram schematically showing the overall arrangement of a solid-state imaging device to which the present invention can be applied.
Figure 2:
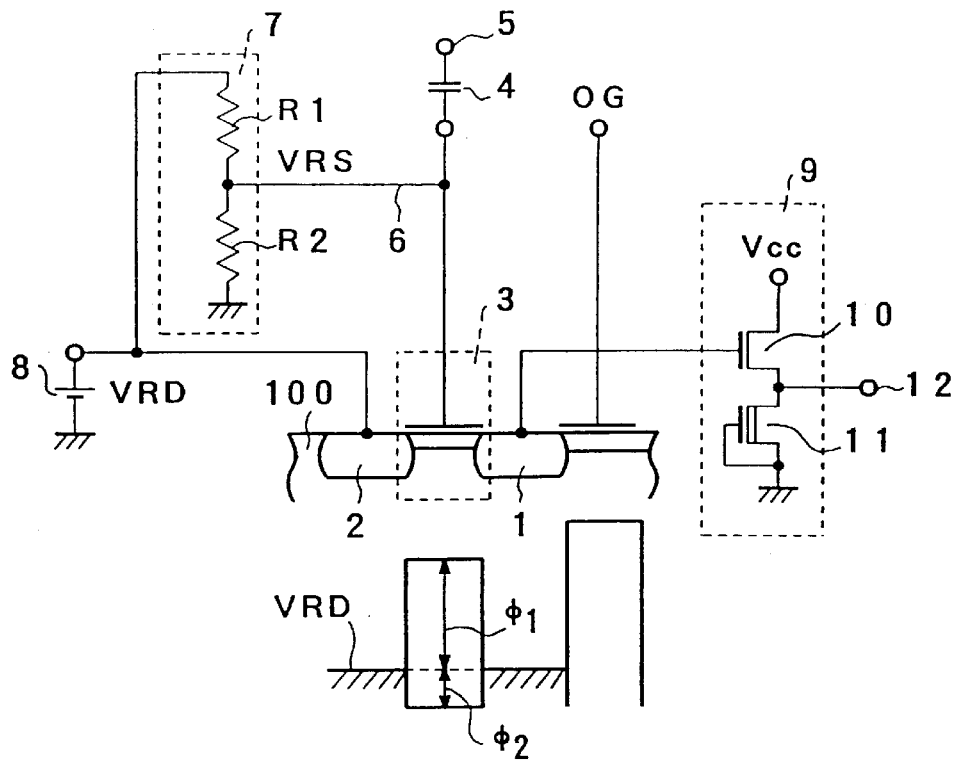
FIG. 2 is a circuit diagram showing the arrangement of a conventional solid-state imaging device.
Figure 3:
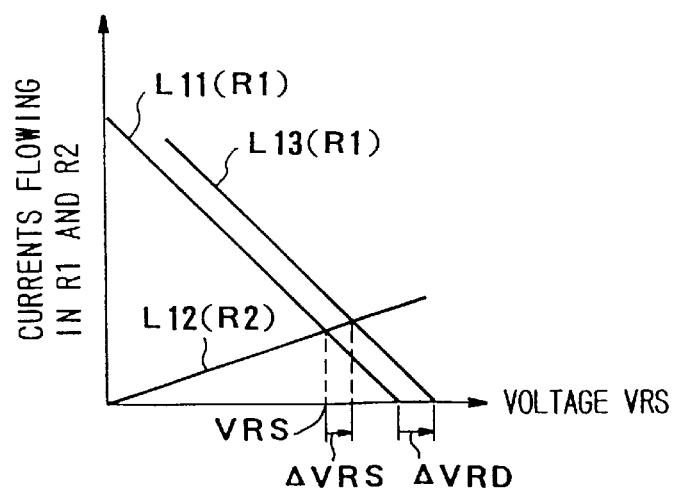
FIG. 3 is a graph showing the relationship between a reset gate voltage VRS and the currents flowing in resistors R1 and R2 in the solid-state imaging device.
Figure 4:
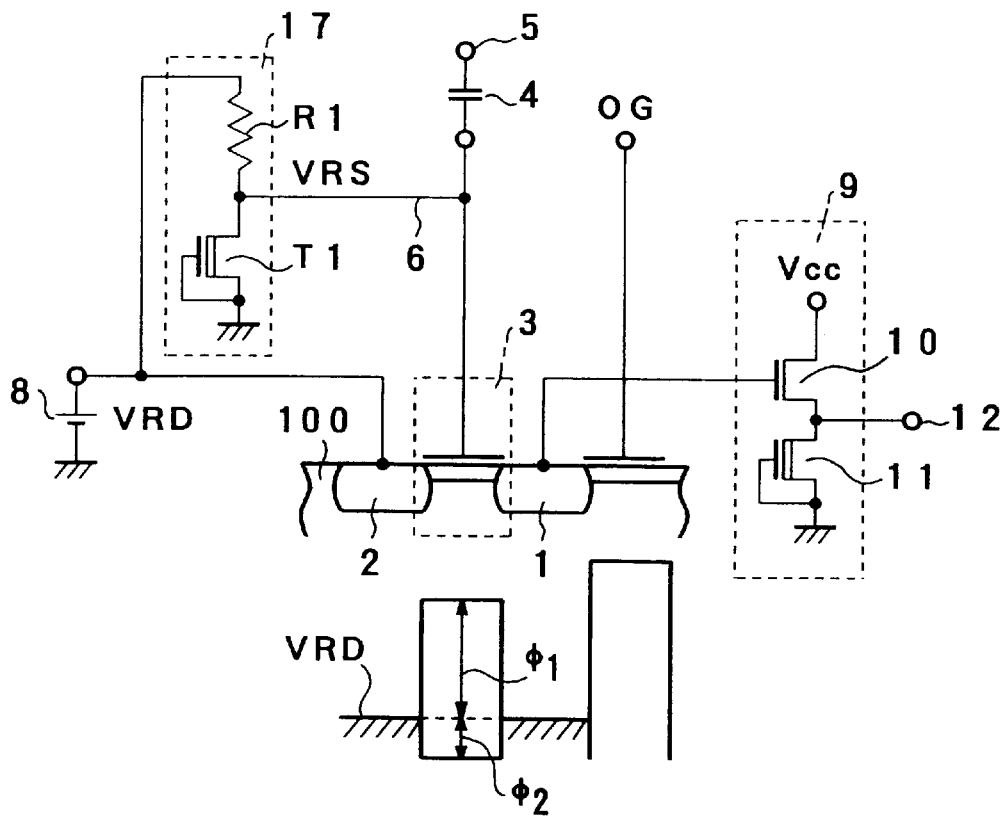
FIG. 4 is a circuit diagram showing the arrangement of a solid-state imaging device according to the first embodiment of the present invention.

FIG. 4 shows the arrangement of a solid-state imaging device according to the first embodiment. The device of this embodiment differs from the conventional device shown in FIG. 2 in the arrangement of a voltage dividing circuit 17. More specifically, in the conventional voltage dividing circuit 7, the resistors R1 and R2 consisting of the diffused resistors are series-connected between the output terminal and ground terminal of the power supply 8. In the voltage dividing circuit 17 in this embodiment, however, a D-type MOS transistor T1 is used as a resistive element in place of the resistor R2. The circuit in FIG. 4 has the same arrangement as that of the circuit in FIG. 2 except for the above part. The same reference numerals in FIG. 4 denote the same parts as in FIG. 2, and a description thereof will be omitted.

The D-type transistor T1 is formed by the same process as that for the D-type transistor formed as the reset transistor 3 and by implanting the same impurity as that implanted therein.

Figure 5:
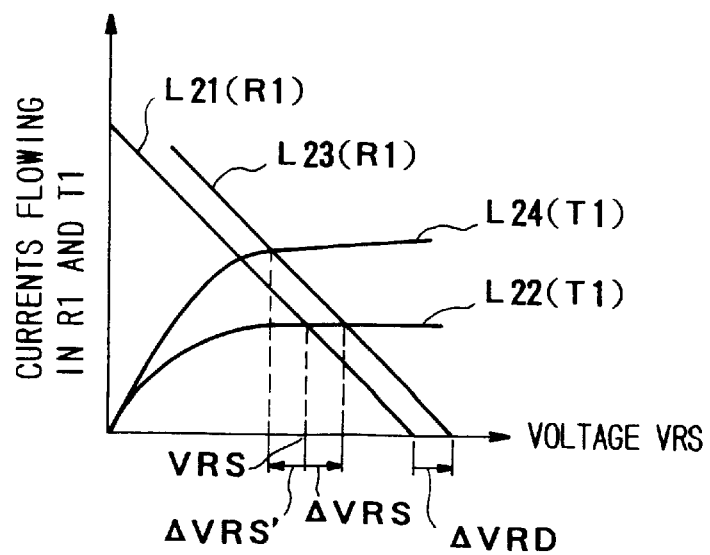
FIG. 5 is a graph showing the relationship between a reset gate voltage VRS and the currents flowing in a resistor R1 and a D-type transistor T1 in the first embodiment.

FIG. 5 shows the relationship between a reset gate voltage VRS and the currents flowing in a resistor R1 and the D-type transistor T1. A curve L21 represents the relationship between changes in the current flowing in the resistor R1 and the reset gate voltage VRS. A curve L22 represents the relationship between the current flowing in the transistor T1 and the reset gate voltage VRS. A curve L23 represents the relationship between the reset gate voltage VRS and the current flowing in the resistor R1 when a power supply voltage VRD rises by ΔVRD. A curve L24 represents the relationship between the reset gate voltage VRS and the current flowing in the transistor T1 when the impurity concentration of the channel region (a depletion-type impurity layer) of the transistor T1 increases, similar to the reset transistor 3.

When the value of the reset gate voltage VRS in this circuit, i.e., the intersection point of the curves L21 and L22, is set in the saturation region of the D-type transistor T1, the current flowing in the transistor T1 remains almost constant even if the reset gate voltage VRS changes. With this operation, the voltage dividing circuit 17 can have a constant current, and the ratio of a variation ΔVRS in the reset gate voltage VRS to the variation ΔVRD in the voltage VRD of a power supply 8 which is applied to the reset drain can be set nearly unity.

In addition, even if the resistance of the region under the reset gate electrode varies because of variations in impurity concentration of the region, the resistance of the D-type transistor T1 of the voltage dividing circuit 17 also varies accordingly. As a result, the potential variation at the region under the reset gate is fed back to resistive division performed by the resistance-type voltage dividing circuit 17. Even if, therefore, the impurity concentration of the region beneath the reset gate electrode varies, the current amount of the transistor T1 of the voltage dividing circuit 17 varies to vary the reset gate voltage VRS in a direction to cancel out the potential variation at the region under the reset gate electrode. If, for example, the impurity concentration of the region under the reset gate electrode exceeds the design value, the potential at the region under the reset gate electrode upon application of a high-level rest pulse exceeds the design value. However, since the impurity concentration of the transistor T1 of the voltage dividing circuit 17 also exceeds the design value, the ON resistance decreases, and the current flowing in the transistor T1 increases, as indicated by the curve L24. The reset gate voltage VRS divided by the resistor R1 and the transistor T1 then becomes lower than the design value by ΔVRS'. As a result, the potential at the region under the reset gate electrode decreases. In this manner, as the impurity concentration at the region under the reset gate electrode varies, the reset gate voltage VRS varies to cancel out the resultant potential variation.

In this case, the variation ΔVRS in the reset gate voltage VRS and the variation in the current flowing in the transistor T1 must be set at a proper ratio so as to cancel out the potential variation at the region under the reset gate electrode. As means of setting such a ratio, for example, the following methods may be used: a method of using more than one reset transistors 3 arranged in parallel with each other, as needed; and a method of adjusting the dimensions W/L of the transistor T1.

Figure 6:
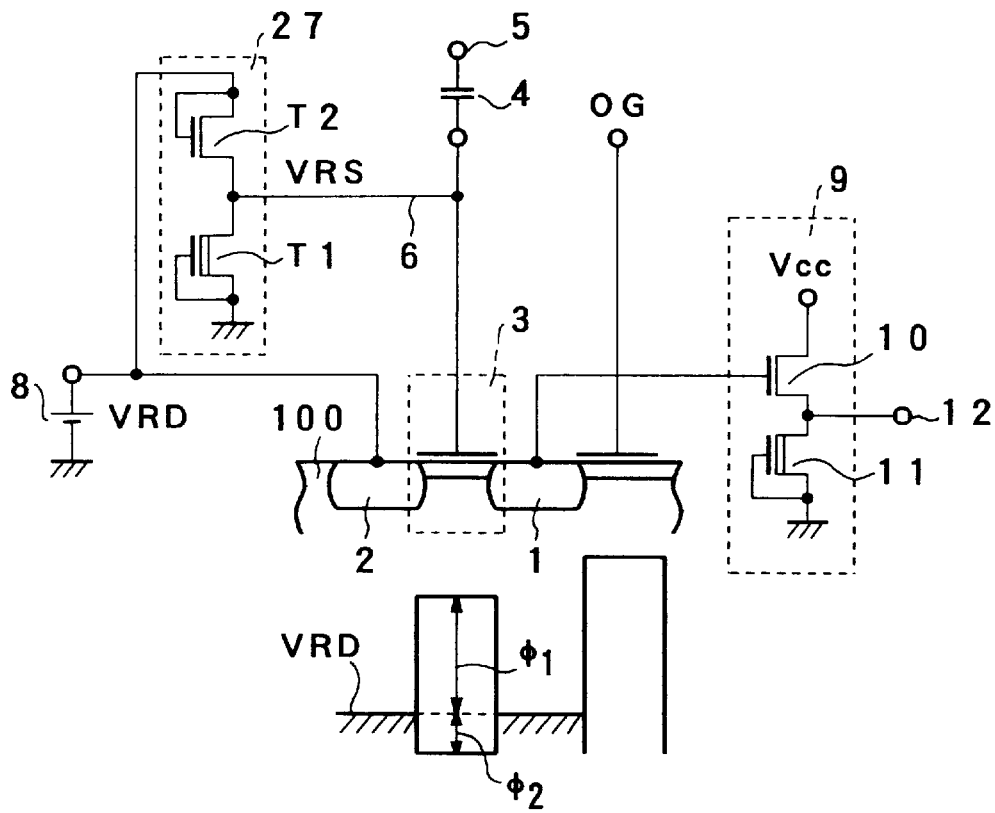
FIG. 6 is a circuit diagram showing the arrangement of a solid-state imaging device according to the second embodiment of the present invention.

The second embodiment of the present invention will be described next with reference to FIG. 6. The arrangement of this embodiment differs from that of the first embodiment in that a voltage dividing circuit 27 uses an enhancement-type (to be referred to as an E-type hereinafter) transistor T2 having a gate connected to the drain in place of the resistor R1.

Figure 7:
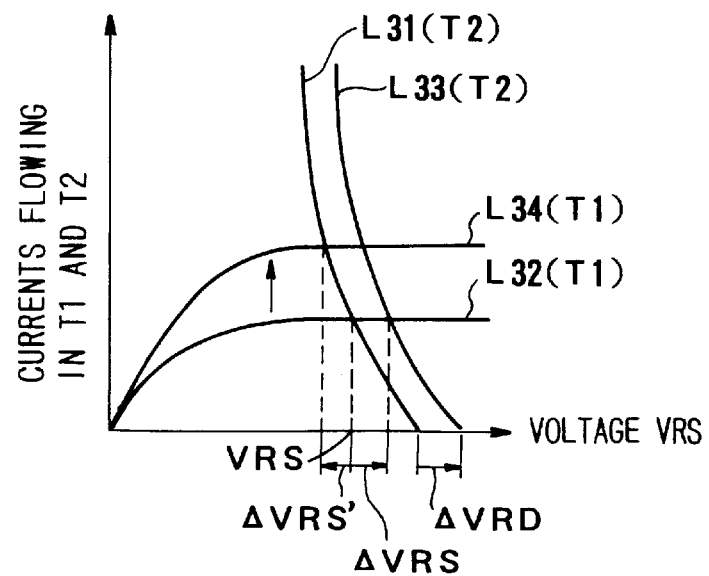
FIG. 7 is a graph showing the relationship between a reset gate voltage VRS and the currents flowing in an E-type transistor T2 and a D-type transistor T1 in the second embodiment.

FIG. 7 shows the relationship between a reset gate voltage VRS and the currents flowing in the E-type transistor T2 and a D-type transistor T1 in the second embodiment.

A curve L31 represents the relationship between changes in the current flowing in the E-type transistor T2 and the reset gate voltage VRS. A curve L32 represents the relationship between the current flowing in the D-type transistor T1 and the reset gate voltage VRS. A curve L33 represents the relationship between the reset gate voltage VRS and the current flowing in the transistor T2 when a reset drain voltage VRD rises by ΔVRD. A curve L34 represents the relationship between the reset gate voltage VRS and the current flowing in the transistor T1 when the impurity concentration of a region under the channel region of the transistor T1 increases.

When the reset gate voltage VRS, which corresponds to the intersection point of the curves L31 and L32, is set in the saturation region of the D-type transistor T1, as in the first embodiment, the current flowing in the transistor T1 remains almost constant even if the reset gate voltage VRS changes. With this operation, the voltage dividing circuit 27 can have a constant current, and the ratio of a variation ΔVRS in the reset gate voltage VRS to the variation ΔVRD in the reset drain voltage VRD applied to the reset drain can be set nearly unity.

In addition, even if the resistance of the region under the reset gate electrode varies as the impurity concentration of the region varies, the resistance of the transistor T1 of the voltage dividing circuit 27 constituted by the same D-type transistor also varies accordingly. As a result, the potential variation at the region under the reset gate is fed back to resistive division performed by the resistance-type voltage dividing circuit 27. Even if, therefore, the impurity concentration of the region under the reset gate electrode varies, the current amount of the transistor T1 of the voltage dividing circuit 27 varies in the direction in which the potential variation at the region under the reset gate electrode is canceled out.

The resistor R1 in the first embodiment consists of the diffused resistor, as described above. When, however, the transistor T2 is used as a resistive element in place of the resistor R1, variations in ON resistance due to variations in impurity concentration can be suppressed more than when the diffused resistor is used. The second embodiment can therefore suppress potential variations at the region underneath the reset gate electrode with variations in impurity concentration more than the first embodiment.

As described above, according to the first and second embodiments, even if the voltage VRD of the power supply 8 which is applied to the reset drain rises by ΔVRD, the voltage VRS applied to the reset gate electrode also changes by approximately the variation ΔVRS. With this operation, the reset transfer margin Φ2 to be set when a high-level pulse is applied to the reset gate electrode can be suppressed. In addition, even if the impurity concentration of the region under the reset gate electrode exceeds the design value, the ON resistance of the D-type transistor T1 decreases to increase the current flowing therein. As a result, the reset gate voltage VRS decreases. The reset barrier margin Φ1 can therefore be suppressed.

As described above, according to this embodiment, both the reset barrier margins Φ1 and Φ2 can be set to small values. For example, in the conventional circuit shown in FIG. 2, the voltage amplitude at the region under the reset gate electrode, which corresponds to the sum of the margins Φ1 and Φ2, must be set to about 3.5 V, and the amplitude of the voltage VRS to be applied to the reset gate electrode must be set to about 4 V. In contrast to this, according to the first and second embodiments described above, the voltage amplitude at the region under the reset gate electrode and the reset gate voltage VRS can be lowered to about 2.5 V and 3 V, respectively. As a result, the pulse amplitude decreases, and hence a reduction in power consumption can be attained. Similar to the peripheral circuits, a lower power supply voltage of 3.3 V or the like can be used. The driver circuit and the like required when a high power supply voltage of 5.5 V or the like is used can be omitted.

Furthermore, according to the embodiment, the above technical effect can be obtained by the simple configuration without increase of circuit scale.

It is to be understood that the above embodiment is considered exemplary only, and the present invention is not limited thereto. For example, in the above embodiments, the voltage dividing circuits 17 and 27 each comprise two resistive elements. However, the reset drain voltage VRD may be divided by using three or more resistive elements to generate the reset gate voltage VRS. In this case, it suffices if the resistive element between a node 6 connected to the reset gate electrode and the ground terminal consists of a D-type transistor.

What is claimed is:

1. A solid-state imaging device comprising:
    a storage section which is formed on a surface portion of a semiconductor substrate to receive and store signal charges;
    a discharge section formed on the surface portion of the semiconductor substrate at a predetermined distance from said storage section;
    a reset section constituted by a depletion-type MOS transistor formed between said storage section and said discharge section; and
    a reset voltage setting section for setting a voltage of a reset pulse to be applied to said reset section,
    wherein said reset voltage setting section has a resistive element and a depletion-type MOS transistor series-connected between one end to which a predetermined voltage is applied and the other end which is grounded, and a node for connecting said resistive element to said depletion-type MOS transistor, the node is connected to a reset voltage application electrode, and said depletion-type MOS transistor has a depletion-type impurity layer formed by the same process as that for a depletion-type impurity layer of said reset section.

2. A device according to claim 1, wherein said reset voltage setting section sets a voltage of the reset pulse within a saturation region of said depletion-type MOS transistor included in said reset voltage setting section.

3. A device according to claim 1, wherein said resistive element comprises a diffused resistor.

4. A device according to claim 1, wherein said resistive element comprises an enhancement-type MOS transistor.

5. A device according to claim 1, wherein said depletion-type impurity layer included in said reset voltage setting section has a substantially same impurity concentration as that of said depletion-type impurity layer of said reset section.

6. A solid-state imaging device comprising:
    a floating diffusion layer which is formed on a surface portion of a semiconductor substrate to receive and store signal charges transferred from an adjacent CCD;
    a reset drain formed on the surface portion of the semiconductor substrate to oppose said floating diffusion layer through a channel region;
    a reset gate electrode which is formed on said channel region through an insulating film, and electrically connects said floating diffusion layer to said reset drain through said channel region upon application of a reset pulse to transfer the signal charges stored in said floating diffusion layer to said reset drain; and a reset voltage setting circuit for setting a voltage of the reset pulse to be applied to said reset gate electrode, wherein said reset voltage setting circuit has a resistive element and a depletion-type MOS transistor series-connected between one end to which a predetermined voltage is applied and the other end which is grounded, and a node for connecting said resistive element to said depletion-type MOS transistor, the node is connected to said reset gate electrode, a channel region of said depletion-type MOS transistor being provided by the same process as that for said channel region of a depletion-type reset transistor including said floating diffusion layer, said reset drain, and said reset gate electrode.

7. A device according to claim 6, wherein said reset voltage setting circuit sets a voltage of the reset pulse within a saturation region of said depletion-type MOS transistor included in said reset voltage setting circuit.

8. A device according to claim 6, wherein said reset voltage setting circuit includes said depletion-type MOS transistor manufactured by the same process as that for a depletion-type reset transistor constituted by said floating diffusion layer, said channel region, said reset drain, and said reset gate electrode, so that an amount of change in impurity concentration of said channel region of said reset transistor due to variations in manufacturing process is substantially the same as an amount of change in impurity concentration of said channel region of said depletion-type transistor included in said reset voltage setting circuit, and when the impurity concentration of said channel region of said reset transistor changes owing to variations in manufacturing process, the voltage of the reset pulse set by said reset voltage setting circuit changes to cancel out the change in impurity concentration.

9. A device according to claim 6, wherein said resistive element comprises a diffused resistor.

10. A device according to claim 6, wherein said resistive element comprises an enhancement-type MOS transistor.

11. A solid-state imaging device comprising:

a floating diffusion layer which is formed on a surface portion of a semiconductor substrate to receive and store signal charges transferred from an adjacent CCD;

a reset drain formed on the surface portion of the semiconductor substrate to oppose said floating diffusion layer through a channel region;

a reset gate electrode which is formed on said channel region through an insulating film, and electrically connects said floating diffusion layer to said reset drain through said channel region upon application of a reset pulse to transfer the signal charges stored in said floating diffusion layer to said reset drain; and a reset voltage setting circuit for setting a voltage of the reset pulse to be applied to said reset gate electrode, wherein said reset voltage setting circuit has a resistive element and a depletion-type MOS transistor series-connected between one end to which a predetermined voltage is applied and the other end which is grounded, and a node for connecting said resistive element to said depletion-type MOS transistor, the node is connected to a reset voltage application electrode, a channel region of said depletion-type MOS transistor being provided by the same process as that for said channel region of a depletion-type reset transistor including said floating diffusion layer, and reset drain, and said reset gate electrode.

12. A device according to claim 11, wherein said reset voltage setting circuit sets a voltage of the reset pulse within a saturation region of said depletion-type MOS transistor included in said reset voltage setting circuit.

13. A device according to claim 11, wherein said reset voltage setting circuit includes said depletion-type MOS transistor manufactured by the same process as that for a depletion-type reset transistor constituted by said floating diffusion layer, said channel region, said reset drain, and said reset gate electrode, so that an amount of change in impurity concentration of said channel region of said reset transistor due to variations in manufacturing process is substantially the same as an amount of change in impurity concentration of said channel region of said depletion-type transistor included in said reset voltage setting circuit, and when the impurity concentration of said channel region of said reset transistor changes owing to variations in manufacturing process, the voltage of the reset pulse set by said reset voltage setting circuit changes to cancel out the change in impurity concentration.

14. A device according to claim 11, wherein said resistive element comprises a diffused resistor.

15. A device according to claim 11, wherein said resistive element comprises an enhancement-type MOS transistor.

16. A solid-state imaging device comprising:

a floating diffusion layer which is formed on a surface portion of a semiconductor substrate to receive and store signal charges transferred from an adjacent CCD;

a charge detecting section for detecting the signal charges stored in said floating diffusion layer and outputting a detection signal;

a reset drain formed on the surface portion of the semiconductor substrate to oppose said floating diffusion layer through a channel region;

a reset gate electrode which is formed on said channel region through an insulating film, and electrically connects said floating diffusion layer to said reset drain through said channel region upon application of a reset pulse to transfer the signal charges stored in said floating diffusion layer to said reset drain; and a voltage applying section, having an output terminal connected to said reset drain, for outputting a predetermined voltage and applying the voltage to said reset drain and a resistance-type voltage dividing unit having one end connected to the output terminal of said voltage applying section, the other end which is grounded, a resistive element and a depletion-type MOS transistor series-connected between said one end and said other end, and a node for connecting said resistive element to said depletion-type MOS transistor, said node being connected to said reset gate electrode, wherein a channel region of said depletion-type MOS transistor is provided by the same process as that for said channel region of a depletion-type reset transistor including said floating diffusion layer, and reset drain, and said reset gate electrode.

17. A device according to claim 16, wherein said resistance-type voltage dividing unit sets a voltage of a reset pulse to be applied to said reset gate electrode within a saturation region of said depletion-type MOS transistor included in said resistance-type voltage dividing unit.

18. A device according to claim 16, wherein said resistive element comprises a diffused resistor.

19. A device according to claim 16, wherein said resistive element comprises an enhancement-type MOS transistor.

20. A device according to claim 16, wherein said channel region included in said resistance-type voltage dividing unit has a substantially same impurity concentration as that of said channel region of said depletion-type reset transistor.

* * * * *